(12) United States Patent
Larkin et al.

(10) Patent No.: US 7,413,947 B2
(45) Date of Patent: Aug. 19, 2008

(54) INTEGRATED HIGH VOLTAGE CAPACITOR HAVING A TOP-LEVEL DIELECTRIC LAYER AND A METHOD OF MANUFACTURE THEREFOR

(75) Inventors: David L. Larkin, Richardson, TX (US);
Ashish V. Gokhale, Allen, TX (US);
Dhaval A. Saraiya, Allen, TX (US);
Quang Xuan Mai, Sugar Lane, TX (US)

(73) Assignee: Texas Instruments Incorporated, Dallas, TX (US)

( * ) Notice: Subject to any disclaimer, the term of this patent is extended or adjusted under 35 U.S.C. 154(b) by 335 days.

(21) Appl. No.: 11/333,222

(22) Filed: Jan. 17, 2006

(65) Prior Publication Data

US 2006/0189068 A1    Aug. 24, 2006

Related U.S. Application Data

(60) Provisional application No. 60/655,959, filed on Feb. 24, 2005.

(51) Int. Cl.
*H01L 21/8234* (2006.01)
(52) U.S. Cl. .................. 438/238; 438/240; 438/257; 438/258; 438/261; 438/275; 257/E21.008
(58) Field of Classification Search .................. 438/246, 438/262
See application file for complete search history.

(56) References Cited

U.S. PATENT DOCUMENTS 4,805,071 A   2/1989   Hutter et al.
5,187,637 A * 2/1993   Embree .................. 361/313
5,702,988 A * 12/1997  Liang ..................... 438/238
5,751,067 A * 5/1998   Mikagi ................... 257/764

OTHER PUBLICATIONS

U.S. Appl. No. 11/249,535, filed Oct. 13, 2005; entitled "Integrated High Voltage Capacitor and a Method of Manufacture Therefor"; to David Larkin, et al.

U.S. Appl. No. 11/250,047, filed Oct. 13, 2005; entitled "Integrated High Voltage Capacitor Having Capacitance Uniformity Structures and A Method of Manufacture Therefor" to David Larkin, et al.

* cited by examiner

*Primary Examiner*—Walter L. Lindsay, Jr.
*Assistant Examiner*—Kyoung Lee
(74) *Attorney, Agent, or Firm*—Frederick J. Telecky, Jr.; Wade J. Brady, III

(57) ABSTRACT

The present invention provides an integrated high voltage capacitor, a method of manufacture therefore, and an integrated circuit chip including the same. The integrated high voltage capacitor, among other features, includes a first capacitor plate (120) located over or in a substrate (105), and an insulator (130) located over the first capacitor plate (120), at least a portion of the insulator (130) comprising an inter-level dielectric layer (135, 138, 143, or 148). The integrated high voltage capacitor further includes a second capacitor plate (160) located over the insulator (130) and a top-level dielectric layer (199) located at least partially along a sidewall of the second capacitor plate (160).

18 Claims, 7 Drawing Sheets

INTEGRATED HIGH VOLTAGE CAPACITOR HAVING A TOP-LEVEL DIELECTRIC LAYER AND A METHOD OF MANUFACTURE THEREFOR

CROSS-REFERENCE TO RELATED APPLICATION

This application is related to U.S. Patent Application No. 60/655,959 entitled "INTEGRATED HIGH VOLTAGE CAPACITOR AND A METHOD OF MANUFACTURE THEREFOR," to David L. Larkin, et al., filed on Feb. 24, 2005, which is commonly assigned with the present invention and incorporated herein by reference as if reproduced herein in its entirety.

TECHNICAL FIELD OF THE INVENTION

The present invention is directed to an integrated high voltage capacitor having a top-level dielectric layer and a method of manufacture therefor.

BACKGROUND OF THE INVENTION

Modern day electronic equipment often requires galvanic isolation between the high voltage side and control signal side thereof. Galvanic isolation means that no electrical current can flow directly between the high voltage side and the control signal side, as there is no direct electrical contact. However, even though the high voltage side and control signal side are galvanically isolated from one another, a signal can flow between the two.

One piece of electronic equipment, among many, that might require the aforementioned galvanic isolation is an x-ray machine. Typically, very high voltages are required to operate an x-ray machine. However, these very high voltages need to be shielded from the patient and/or operator of the x-ray machine. Another piece of electronic equipment that might require the aforementioned galvanic isolation is a motor controller. For example, galvanic isolation could be used to electrically separate the 220 Volt motor windings from the control module.

In each of the uses of galvanic isolation, the solution needs to be fast, compact, capable of integration into the preexisting systems, and immune to electromagnetic noise. Moreover, many of the solutions must receive certification from the Association for Electrical, Electronic & Information Technologies (VDE), Underwriters Laboratories (UL), CSA International (CSA), International Organization for Standardization (ISO), etc. These certifications often require robust solutions (e.g., reliable for an extended period of time) capable of withstanding extremely high DC voltages, as well as RMS voltages. These certifications also require for the solutions to have a relatively high transient immunity (e.g., the ability to handle voltage spikes).

Given the aforementioned desires for galvanic isolation, as well as the requirements thereof, the electronics industry has focused on a number of different solutions. One such solution is the placement of a discrete high voltage capacitor (or pairs of capacitors) between the high voltage side and control signal side of the electronics equipment. These discrete high voltage capacitors are located on a separate substrate than the control signal circuitry is located on, and connected to the control signal side using wire bonds.

Unfortunately, the galvanic isolation provided using these discrete high voltage capacitors is often insufficient for today's electronics equipment. For instance, because it is difficult to manufacture these discrete high voltage capacitors having matched capacitance values (e.g., within less than about 2 percent), the capacitors have inadequate transient immunity values. The discrete high voltage capacitors fail in other areas also.

Accordingly, what is needed in the art is a high voltage capacitor, and a method of manufacture therefore, that does not experience the drawbacks of the prior art discrete high voltage capacitors.

SUMMARY OF THE INVENTION

To address the above-discussed deficiencies of the prior art, the present invention provides an integrated high voltage capacitor, a method of manufacture therefore, and an integrated circuit chip including the same. The integrated high voltage capacitor, among other features, includes a first capacitor plate located over or in a substrate, and an insulator located over the first capacitor plate, at least a portion of the insulator comprising an interlevel dielectric layer. The integrated high voltage capacitor further includes a second capacitor plate located over the insulator and a top-level dielectric layer located at least partially along a sidewall of the second capacitor plate.

The present invention provides, in another embodiment, a method for manufacturing an integrated high voltage capacitor. The method for manufacturing the integrated high voltage capacitor, without limitation, includes forming the first capacitor plate, insulator, second capacitor plate, and top-level dielectric layer detailed in the paragraph above.

As has been briefly mentioned, another embodiment of the present invention is an integrated circuit chip. The integrated circuit chip may include one or more transistors located over or in a substrate, the one or more transistor having one or more interlevel dielectric layers located thereover, and a high voltage capacitor including a first capacitor plate, an insulator, a second capacitor plate located at least partially in or over the substrate, and a top-level dielectric layer located at least partially along a sidewall of the second capacitor plate, wherein at least one of the one or more interlevel dielectric layers forms at least a portion of the insulator.

BRIEF DESCRIPTION OF THE DRAWINGS

The invention is best understood from the following detailed description when read with the accompanying FIGURES. Reference is now made to the following descriptions taken in conjunction with the accompanying drawings, in which.

DETAILED DESCRIPTION

The present invention is based, at least in part, on the recognition that high voltage capacitors may be integrated with standard transistors over or in a single substrate. Heretofore the present invention, the industry thought it impossible to achieve the breakdown voltages required for such high voltage capacitors if they were integrated over or in the same substrate as the transistors. The present invention, however, acknowledged that by using one or more of the interlevel dielectric layers (ILDs) traditionally located over the transistors as at least a portion of the insulator of the high voltage capacitors, the required breakdown voltages could be attained while incorporating the high voltage capacitors and transistors together. Accordingly, but for this acknowledgment, as well as other related acknowledgements, the industry would not attempt to integrate the high voltage capacitors and transistors over or in the same substrate.

The present invention has further recognized that parasitic leakage exists, in certain instances, between the upper capacitor electrode and other conductive features located proximate thereto. For instance, it has been observed that parasitic leakage between the upper capacitor electrode and other bond pads located proximate thereto or between the upper capacitor electrode and other conductive traces located thereunder, may lead to breakdown of the capacitor. In turn, the present invention acknowledged that a top-level dielectric layer could be located at least partially along a sidewall of the second capacitor plate, and thereby reduce the aforementioned parasitic leakage.

For the purpose of completeness, various terms used throughout this disclosure should be defined. One such term that needs defining is a high voltage capacitor. Thus, a high voltage capacitor, as used throughout this invention, is a capacitor that may withstand in excess of 200 volts continuously throughout its useful lifetime. Another such term that needs defining is an interlevel dielectric layer. An interlevel dielectric layer, as used herein, is any dielectric layer used to electrically isolate transistor level features from the metal level located directly thereover, or any dielectric layer used to electrically isolate two adjacent metal levels. Accordingly, the dielectric layer used to isolate the transistor level features from the first metal level would be considered an interlevel dielectric layer. Similarly, the dielectric layer used to separate the first metal level from the second metal level, and so on and so forth, would also be considered an interlevel dielectric layer.

Figure 1:
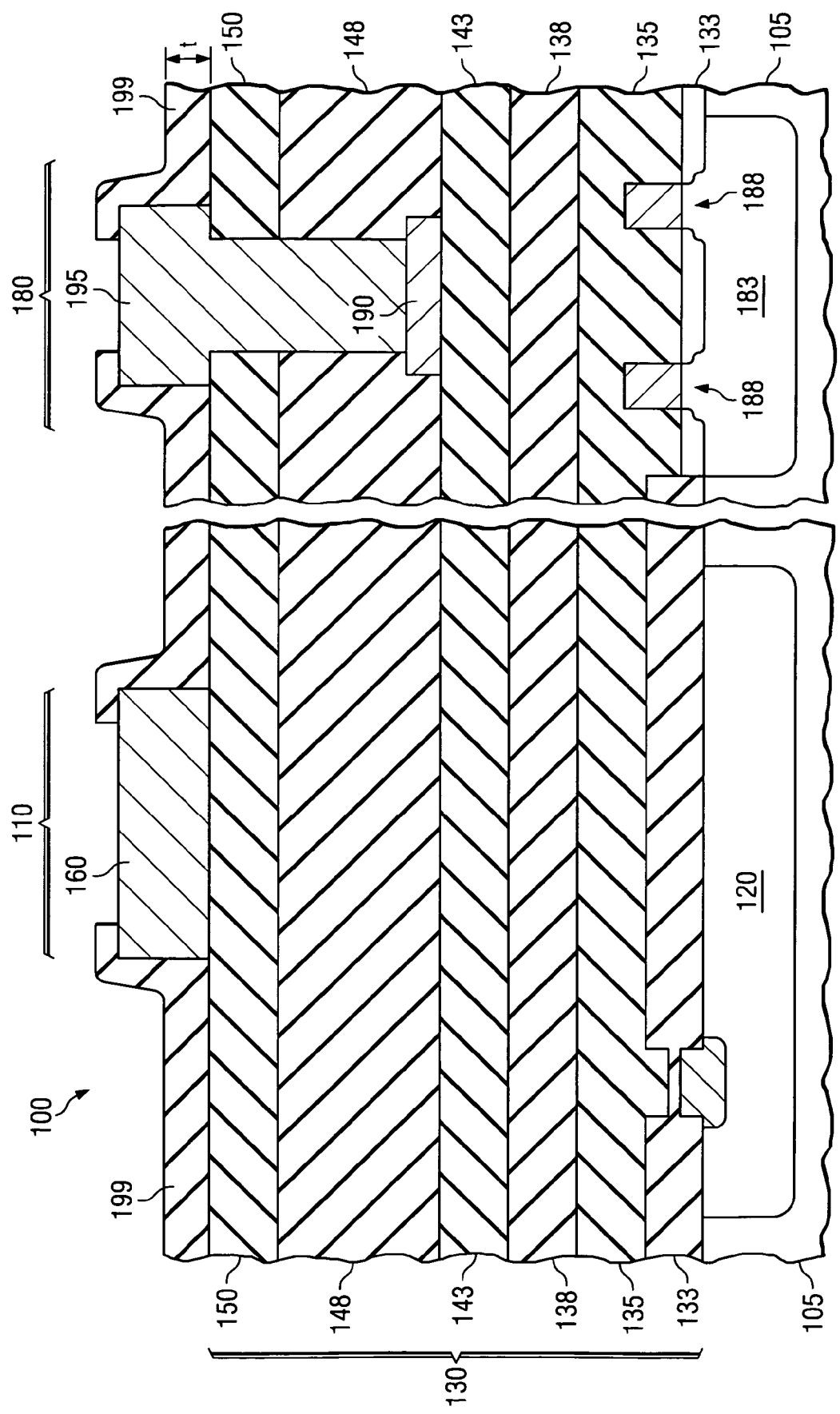
FIG. 1 illustrates a sectional view of one embodiment of an integrated circuit chip manufactured in accordance with the principles of the present invention.

Turning now to FIG. 1, illustrated is a sectional view of one embodiment of an integrated circuit chip 100 manufactured in accordance with the principles of the present invention. The chip 100 includes a high voltage capacitor region 110 and a transistor region 180 integrated over or in the same substrate 105. As those skilled in the art appreciate, the high voltage capacitor region 110 includes an insulator disposed between a first capacitor plate and a second capacitor plate. In accordance with the principles of the present invention, at least a portion of the insulator of the high voltage capacitor region 110 includes an interlevel dielectric layer (ILD).

In the illustrative embodiment of FIG. 1, the high voltage capacitor region 110 includes an insulator 130 disposed between a first capacitor plate 120 and a second capacitor plate 160. In this embodiment, the first capacitor plate 120 is a doped region in the substrate 105. For example, the first capacitor plate 120 in the embodiment of FIG. 1 is a heavily doped n-well region having a peak dopant concentration ranging from about 1E18 atoms/cm$^3$ to about 1E19 atoms/cm$^3$. The first capacitor plate 120 further includes a low resistance contact portion located therein. In those instances wherein the first capacitor plate 120 comprises the heavily doped n-well region, the low resistance contact portion comprises a similar type dopant, but has a dopant concentration higher than that of the heavily doped n-well region.

The insulator 130 in the embodiment of FIG. 1 comprises at least one ILD layer. For example, as shown, the insulator 130 of FIG. 1 includes a field oxide region 133, a first ILD layer 135, a second ILD layer 138, a third ILD layer 143, a fourth ILD layer 148, and a protective overcoat layer 150. It should be noted that in certain instances the upper most ILD layer (in this instance the fourth ILD layer 148) and the protective overcoat layer 150 will collectively be referred to as the protective overcoat layer. Such a reference scheme should not be used to alter the scope of the present invention. Accordingly, the insulator 130 in the embodiment of FIG. 1 comprises the various dielectric layers located between the first capacitor plate 120 and the second capacitor plate 160.

It should be noted that the thicknesses of the different layers comprising the insulator 130 might be modified to provide varying capacitance values. For example, in the embodiment shown in FIG. 1 the thickness of the fourth ILD layer 148 was nearly doubled, at least as compared to the other ILD layers 135, 138, 143, to provide the requisite capacitance values. Similarly, additional ILD layers could also be added or removed to affect the desired capacitance values.

The second capacitor plate 160 in the embodiment of FIG. 1 comprises a conductive feature located over the protective overcoat layer 150. More specifically, the second capacitor plate 160, in the embodiment shown, comprises a copper conductive feature. As those skilled in the art will appreciate, the use of the copper conductive feature as the second capacitor plate 160 integrates well into the traditional back-end transistor process flow, such as during the formation of bond pads.

The high voltage capacitor region 110 illustrated in FIG. 1 might be similar to that required in certain extremely high voltage scenarios. Particularly, the high voltage capacitor region 110 illustrated in FIG. 1 might be used to accommodate voltages including and in excess of about 3000 volts peak.

The transistor region 180 in the embodiment of FIG. 1 includes one or more transistors 188 that are located in or over a well region 183. The well region 183, similar to the first capacitor plate 120, comprises a highly doped n-type well region. As will be further discussed below, the first capacitor plate 120 and the well region 183 may be advantageously formed in the same processing step, at least in those embodiments wherein the first capacitor plate 120 comprises the highly doped n-type well region. The one or more transistors 188, as those skilled in the art appreciate, include gate dielectrics, gate electrodes, source/drain regions, etc. While the one or more transistors 188 illustrated in FIG. 1 are metal oxide semiconductor (MOS) transistors, other embodiments of the present invention exist wherein they are bipolar transistors, or a combination of MOS and bipolar transistors.

Located over the one or more transistors 188 are the first, second, third and fourth ILD layers 135, 138, 143, 148. Additionally located over the one or more transistors is an upper conductive lead 190. The upper conductive lead 190 in the embodiment of FIG. 1 is located between the third ILD layer 143 and the fourth ILD layer 148. However, other embodiments exist wherein the upper conductive lead 190 is located elsewhere.

Contacting the upper conductive lead 190, and providing electrical contact to the one or more transistors 188 may be a conductive feature 195. The conductive feature 195, in this embodiment a bond pad, may be advantageously formed in the same processing step as the second capacitor plate 160, thus in the embodiment of FIG. 1 the second conductive feature 195 may also comprise copper.

Positioned at least partially along a sidewall of the second capacitor plate 160 of FIG. 1 is a top-level dielectric layer 199. As illustrated, the top-level dielectric layer 199 may be located entirely along the sidewall and may further extend over at least a portion of an upper surface of the second capacitor plate 160. In the embodiment shown, the top-level dielectric layer 199 is located along a top surface of the protective overcoat layer 150, which in this embodiment is the outer most coating before the bond pads are formed, and extends along the sidewalls and over at least a portion of an upper surface of each of the second capacitor plate 160 and the conductive feature 195.

The top-level dielectric layer 199 may encompass a variety of different materials and thicknesses while staying within the scope of the present invention. Nevertheless, various spin-on and deposited dielectrics have been observed to provide excellent results. For instance, the spin-on dielectric could be one form of a spin-on polymer (e.g., polyimide, benzyl chlorobutene (BCB), polybenzoxasole (PBO), etc.), or alternatively another non-polymer spin-on dielectric (e.g., hydrogen silsesquioxane (HSQ), spin-on-glass (SOG), etc.). Alternatively, the top-level dielectric layer 199 could be a deposited dielectric, such as silicon dioxide, silicon nitride, silicon carbide, etc.

The thickness (t) of the top-level dielectric layer 199 is an important feature related to the amount of reduction in the parasitic leakage obtained using the top-level dielectric layer 199. For instance, the greater the thickness of the top-level dielectric layer 199, the further that the top-level dielectric layer 199 extends up the sidewall of the second capacitor plate 160, and presumably better reduction in parasitic leakage. Accordingly, it has been observed in one embodiment that the top-level dielectric layer 199 should have a thickness of about 5 µm or more. In an alternative embodiment, however, the top-level dielectric layer 199 should have a thickness ranging from about 5 µn to about 20 µn. Nevertheless, other thicknesses could be used while staying within the scope of the present invention.

The high voltage capacitor of FIG. 1 provides a number of benefits over traditional discrete high voltage capacitors. First, as the high voltage capacitor is integrated with the transistors in or over the same substrate, many of the processing steps used to manufacture the transistors may also be used to simultaneously form the integrated high voltage capacitor. In one embodiment, no additional processing steps (i.e., other than those steps previously required) are needed to manufacture the high voltage capacitor. This alone, amounts to a tremendous saving of both time and expense. Integrating the high voltage capacitor into an integrated circuit chip with transistors further provides a significant space savings.

Apart from the time, expense and space savings discussed directly above, the integrated high voltage capacitor also provides improved reliability and transient immunity. The improved reliability comes, at least partially, from the high quality of the insulator. Additionally, the improved transient immunity comes at least in part, from the ability to precisely match the different integrated high voltage capacitors that might be used together. For example, because the integrated high voltage capacitors are formed using a highly tuned process flow (e.g., that used for years to manufacture integrated circuits), the various different integrated high voltage capacitors may be precisely matched. In one embodiment, the various different integrated high voltage capacitors have capacitance values that differ by about two-percent or less. In another embodiment, the capacitance values differ by less than about one percent.

It should additionally be noted that the top-level dielectric layer provides additional benefits. For example, the top-level dielectric layer provides reduced parasitic breakdown paths during high voltage events. Moreover, it attempts to help isolate any contaminates located along the outer surface of the package (e.g., copper contaminants) that might provide a leakage path between the conductive features. Moreover, as a result of the reduced parasitic breakdown, the metal design rules may be relaxed. Specifically, the improved isolation provided by the top-level dielectric layer allows for smaller spacing between the conductive features, and thus a smaller package.

Turning now to FIGS. 2-8, illustrated are sectional views illustrating how one skilled in the art might manufacture an integrated circuit chip in accordance with the principles of the present invention. While FIGS. 2-8 are specifically directed to the manufacture of an integrated circuit chip, FIGS. 2-8 also illustrate, in a broad sense, how one skilled in the art might manufacture a integrated high voltage capacitor in accordance with the principles of the present invention. Thus, a method for manufacturing an integrated high voltage capacitor is discussed within the confines of discussing how one skilled in the art might manufacture an integrated circuit chip with respect to FIGS. 2-8. Nevertheless, while each of these ideas is discussed and illustrated using a single set of FIGURES, neither should be limiting on the other.

Figure 2:
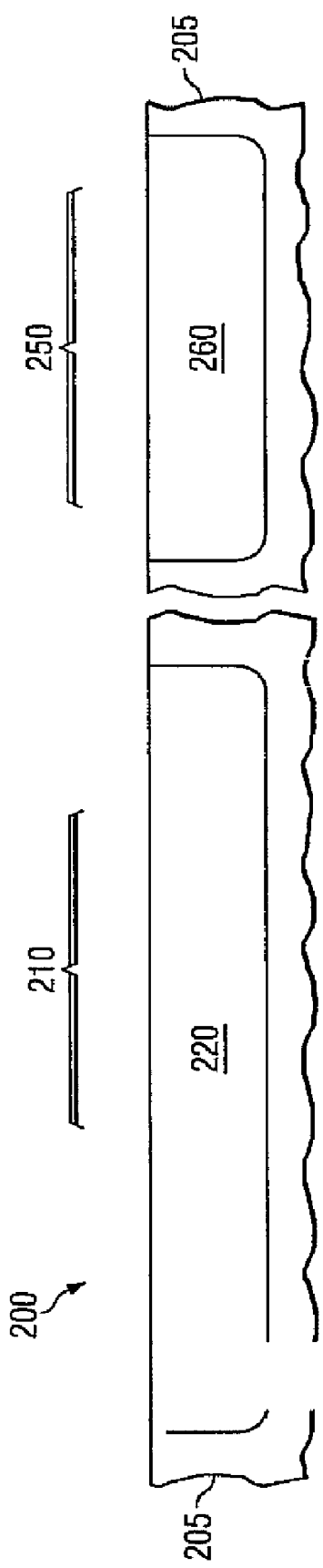
FIGS. 2-8 illustrate sectional views of an integrated circuit chip at various different stages of formation.

FIG. 2 illustrates a sectional view of an integrated circuit chip 200 at an initial stage of formation. The chip 200 illustrated in FIG. 2 initially includes a semiconductor substrate 205. The substrate 205 illustrated in FIG. 2 may, in one embodiment, be any layer located in the partially completed chip 200, including a wafer itself or a layer located above the wafer (e.g., epitaxial layer). In the illustrative embodiment shown, however, the substrate 205 comprises an epitaxial silicon layer.

Located in/on/over the substrate 205 are two device regions, including a high voltage capacitor region 210 and a transistor region 250. Positioned in the substrate 205 in the high voltage capacitor region 210 is a doped region 220. The doped region 220, in one embodiment, is a heavily doped n-type well region. For example, the heavily doped n-type well region might have a peak dopant concentration ranging from about 1E16 atoms/cm$^3$ to about 1E20 atoms/cm$^3$. Other embodiments could also exist wherein the doped region 220 is a heavily doped p-type well region. As will be understood more fully below, the doped region 220 will ultimately form a first capacitor plate of the high voltage capacitor region 210

Positioned in the substrate 205 in the transistor region 250 is another doped region 260. The doped region 260, similar to the doped region 220, may comprise a heavily doped n-type well region. In one embodiment of the present invention, the doped region 260 and the doped region 220 are formed using a photoresist mask in a series of shared processing steps. Accordingly, in this embodiment the doped region 260 might also have a peak dopant concentration ranging from about 1E16 atoms/cm$^3$ to about 1E20 atoms/cm$^3$.

Figure 3:
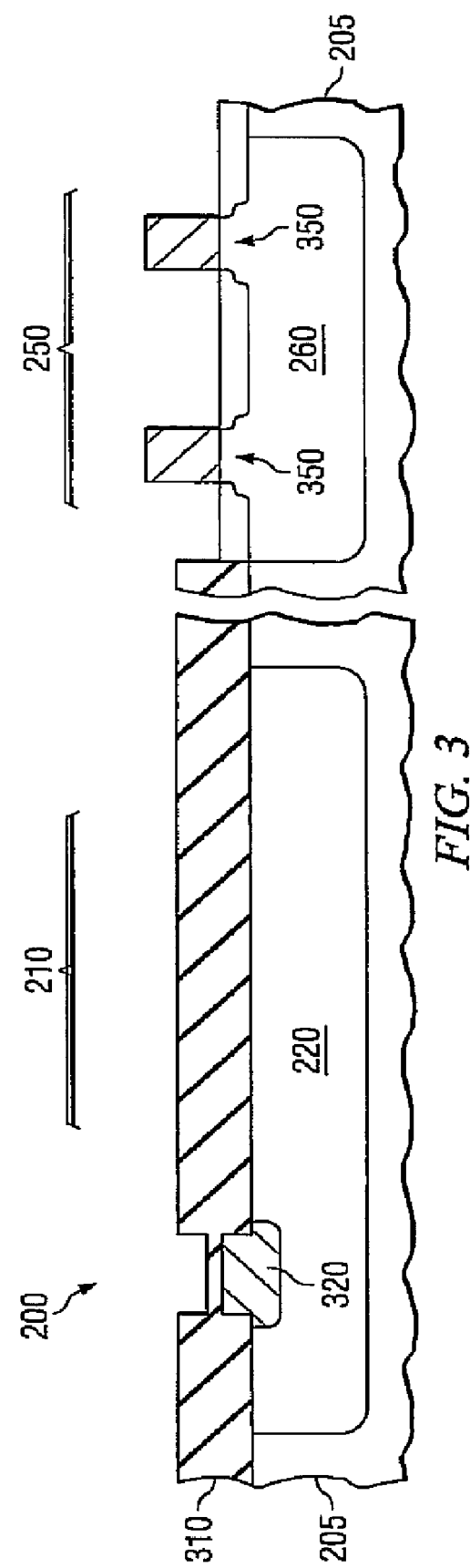

Turning now to FIG. 3, illustrated is the chip 200 of FIG. 2 after forming various features in and over the high voltage capacitor region 210 and the transistor region 250 of the substrate 205. Formed over the substrate 205 in at least a portion of the high voltage capacitor region 210 is a field oxide layer 310. The field oxide layer 310 illustrated in FIG. 3 happens to be a LOCOS field oxide layer, however, other embodiments exist wherein other field oxide layers might be used. Those skilled in the art understand the conventional processes that might be used to form the field oxide layer 310.

As is illustrated in FIG. 3, the field oxide layer 310 helps define a low resistance contact portion 320 in the doped region 220. As one would expect, the low resistance contact portion 320 would allow for electrical connection to the doped region 220, and thus the first capacitor plate of the high voltage capacitor region 210. In one embodiment of the present invention, the low resistance contact portion 320 would advantageously have a peak dopant concentration ranging from about 1E14 atoms/cm³ to about 1E15 atoms/cm³, and would be doped with the same type dopant as the doped region 220.

The transistor region 250 includes conventional transistors 350 located over or in the doped region 260. As those skilled in the art appreciate, the one or more conventional transistors include conventionally formed gate dielectrics, gate electrodes, source/drain regions, etc. As those skilled in the art understand the conventional processes that might be used to manufacture the one or more transistors 350 within the transistor region 250, no further detail regarding their manufacture is needed. It should again be noted that the one or more transistors 350 might comprise other types of transistors, for example bipolar transistors in one embodiment, and remain within the purview of the present invention.

Figure 4:
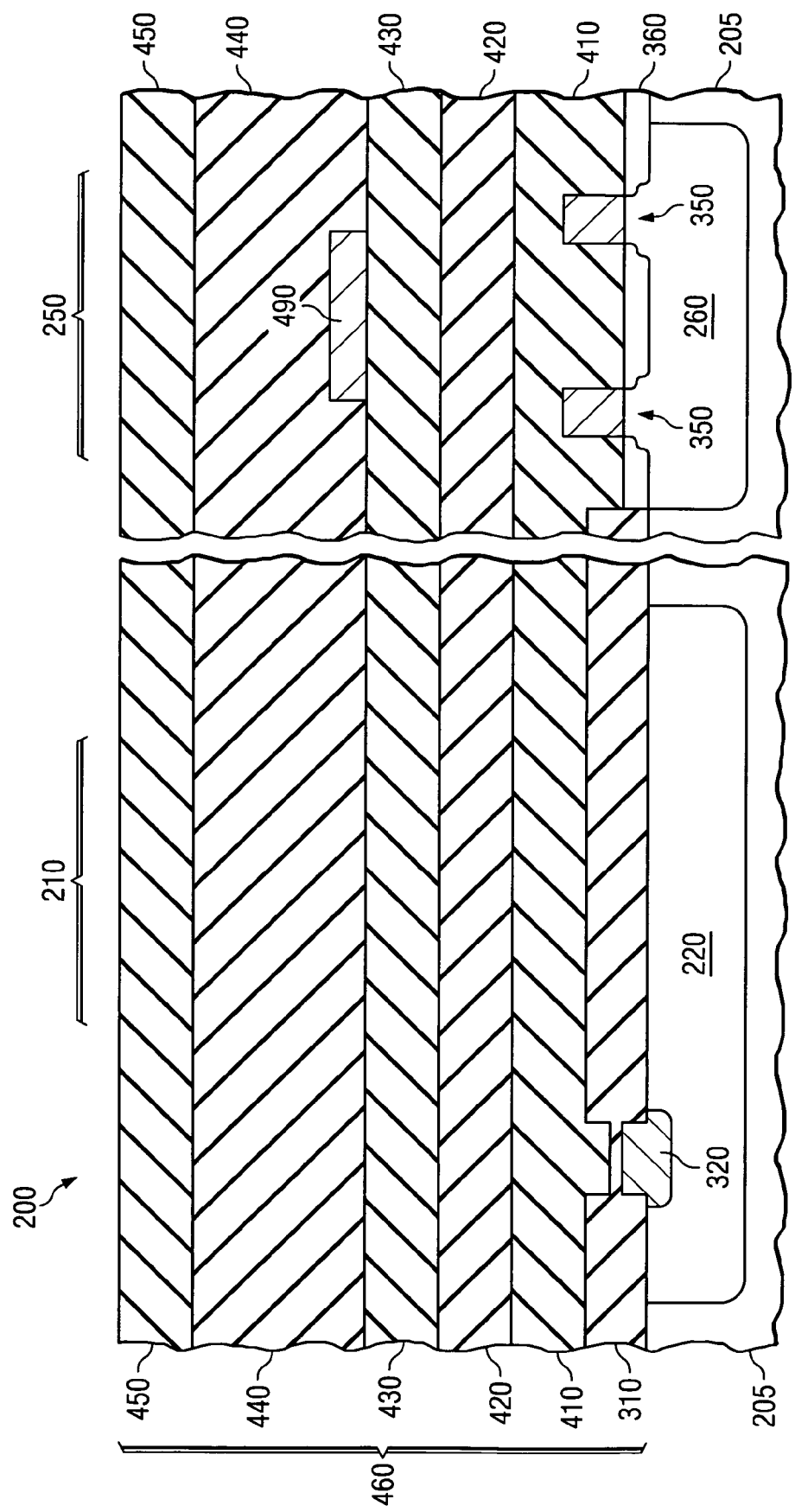

Turning now to FIG. 4, illustrated is the chip 200 of FIG. 3 after forming various different insulator layers over the substrate 205 in both the high voltage capacitor region 210 and the transistor region 250. As is illustrated in FIG. 4, a first ILD layer is formed directly over the field oxide layer 310 and the one or more transistors 350. The first ILD layer 410, among others, might comprise a conventionally formed 0.7 μm borophosphorous silicate glass (BPSG) layer.

Figure 7:
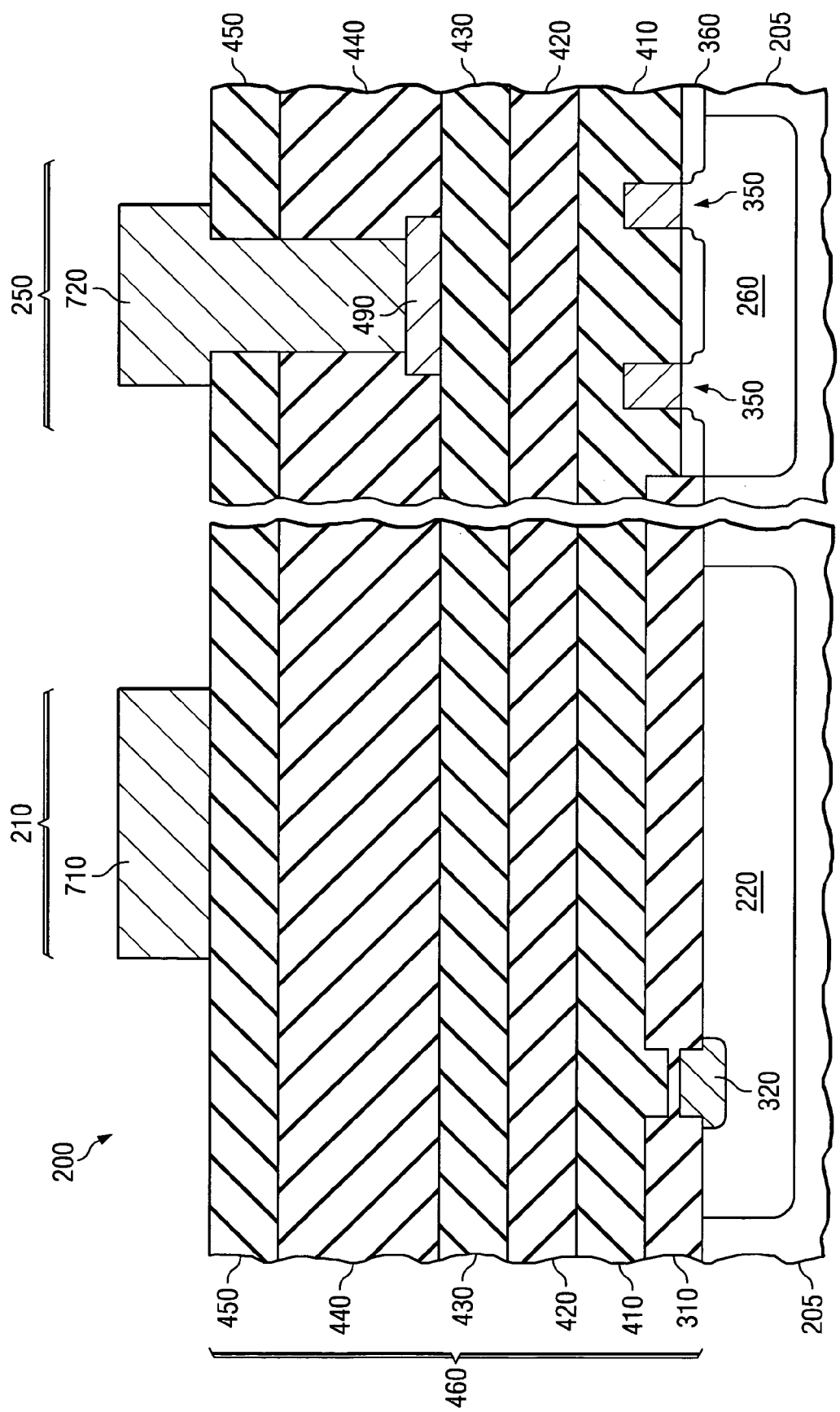

Formed over the first ILD layer 410 is a second ILD layer 420. The second ILD layer 420, in one embodiment, might comprise a conventionally formed 1.20 μm tetra ethyl ortho silicate (TEOS) layer. Additionally formed over the second ILD layer 420 in the embodiment of FIG. 4 is a third ILD layer 430 and a fourth ILD layer 440. In the embodiment shown, the third ILD layer 430 comprises a conventionally formed 1.20 μm TEOS layer and the fourth ILD layer 440 comprises a conventionally formed 2.6 μm TEOS layer. The difference in thickness between the third and fourth ILD layers 430, 440, is due, in part, to the desire to provide additional insulator thickness between the doped region 220, and thus the first capacitor plate, and the second capacitor plate 710 (FIG. 7).

Conventionally formed over the fourth ILD layer 440 is a protective overcoat layer 450. The protective overcoat 450 may have many different thicknesses while staying within the purview of the present invention; however, in the embodiment of FIG. 4 the protective overcoat layer 450 has a thickness ranging from about 1.0 μm to about 2.0 μm.

As is illustrated in FIG. 4, the collection of the field oxide layer 310, first ILD layer 410, second ILD layer 420, third ILD layer 430, fourth ILD layer 440 and the protective overcoat layer 450 comprise an insulator 460 of the high voltage capacitor region 210. Were other insulator layers to be located between the doped region 220 and the second capacitor plate 710 (FIG. 7), those insulator layers might also comprise a portion of the insulator 460.

Formed between the third ILD layer 430 and the fourth ILD layer 440 in the transistor region 250 is an upper conductive lead 490. The upper conductive lead 490, in the embodiment of FIG. 4, comprises aluminum and is configured to provide electrical connection to one or more of the transistors 350 located therebelow. As those skilled in the art understand the process for forming the upper conductive lead 490, including depositing a blanket layer of aluminum on the third ILD layer 430 and patterning the blanket layer of metal to form the upper conductive lead 490, no further detail is warranted.

Figure 5:
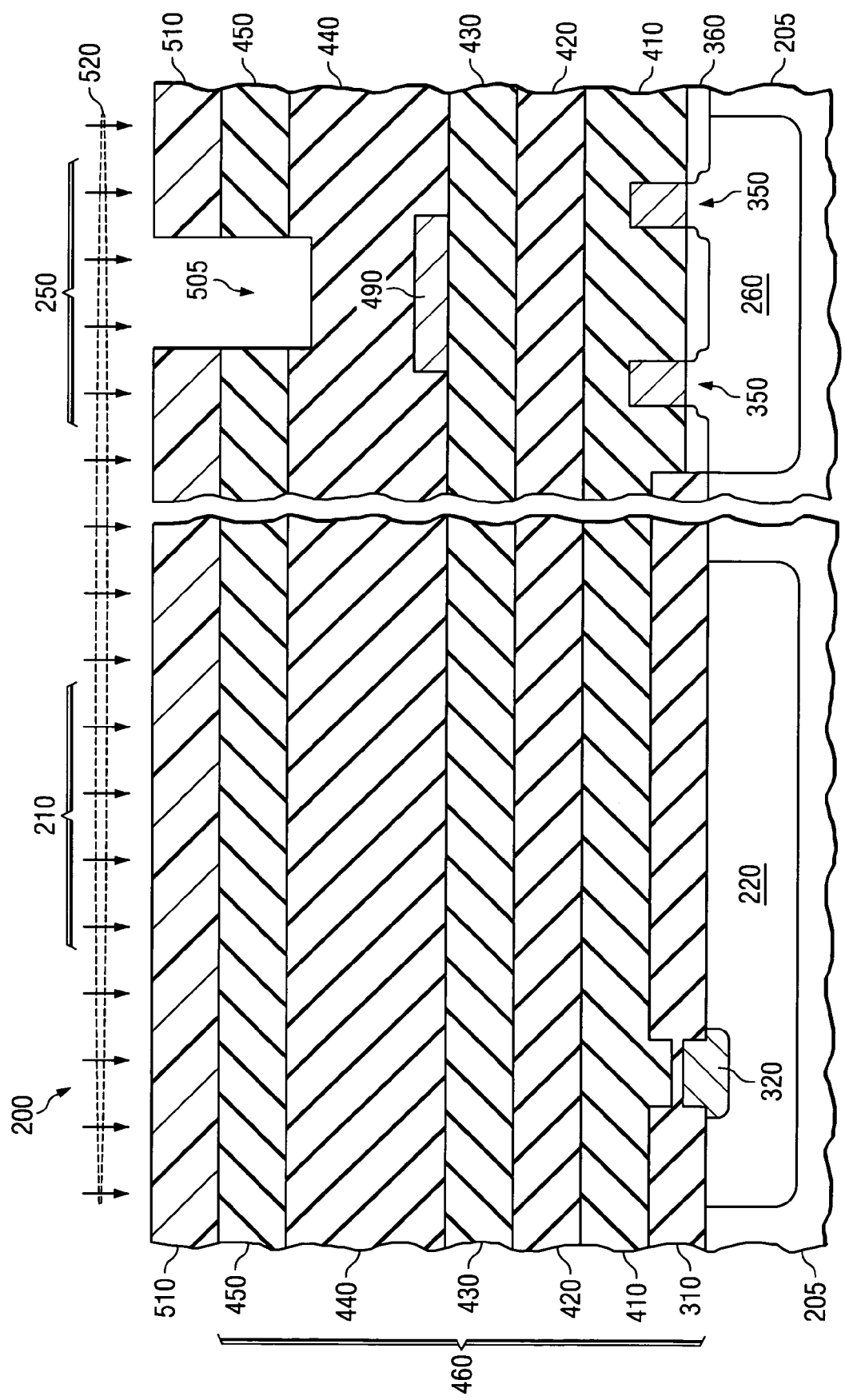

Turning now to FIG. 5, illustrated is the chip 200 of FIG. 4 after forming an opening 505 through at least a portion of the protective overcoat layer 450. In the embodiment shown, the opening 505 is formed entirely through the protective overcoat 450 and into the fourth ILD layer 440. The first etch 520 should, in one embodiment, stop before breaking through the fourth ILD layer 440. Many different etchants could be used to form the opening 505; however, one embodiment of the present invention advantageously uses a first dry etch.

Figure 6:
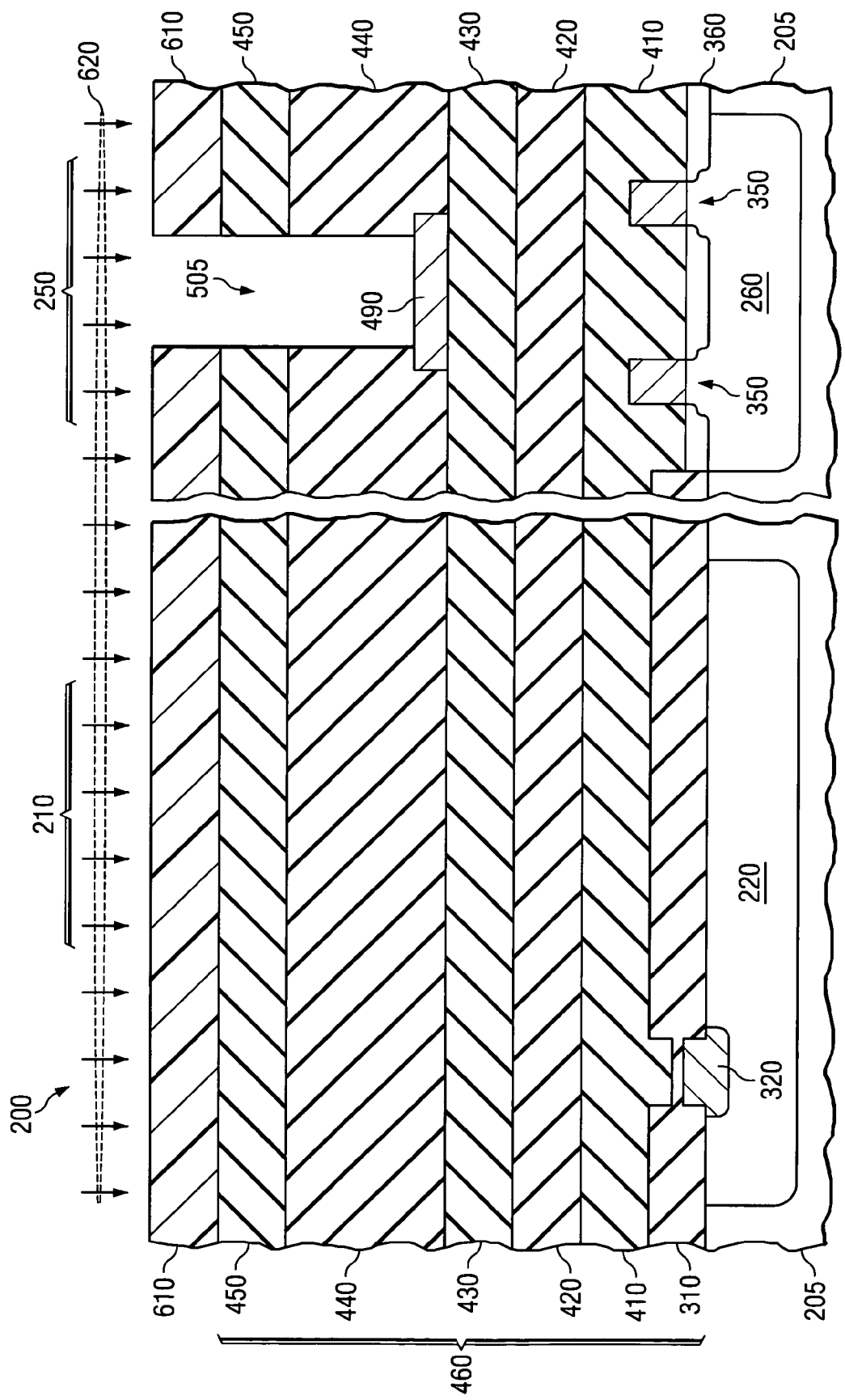

Turning now to FIG. 6, illustrated is the chip 200 of FIG. 5 after removing the first patterned photoresist layer 510, forming a second patterned photoresist layer 610 and completing the opening 505 through the remaining portion of the fourth ILD layer 440. In the embodiment shown, the opening 505 is formed through the fourth ILD layer 440 using the second patterned photoresist layer 610 and the second etch 620. The second etch 620 should, as a result of the first etch 520, not have a problem with breaking through the fourth ILD layer 440 before contacting the upper conductive lead 490. Again, many different etchants could be used to complete the opening 505; however, one embodiment of the present invention uses a second dry etch.

The double pass photo and etch process described using FIGS. 5 and 6 may be used to accommodate the very deep opening 505 that is needed to clear the protective overcoat layer 450 and the extremely thick fourth ILD layer 440, and thereby contact the upper conductive lead 490, without compromising the protective overcoat layer 450. The double pass photo and etch process enables standard photoresists, steppers, and plasma etch tools to achieve a very deep opening 505, while maintaining full passivation integrity. Accordingly, no exotic photoresist films, stepper configurations or etch plasma chemistries are needed to form the opening 505 through the protective overcoat layer 450 and the extremely thick fourth ILD layer 440.

Turning now to FIG. 7, illustrated is the chip 200 of FIG. 6 after forming a second capacitor electrode 710 over the protective overcoat layer 450 in the high voltage capacitor region 210, and forming a conductive feature 720 over and within the opening 505 in the protective overcoat layer 450 in the transistor region 250. In the embodiment shown, both the second capacitor electrode 710 and the conductive feature 720 comprise a relatively thick layer of copper. For instance, in one embodiment of the present invention, both the second capacitor electrode 710 and the conductive feature 720 have a thickness ranging from about 9 μm to about 15 μm above the protective overcoat 450. Other thicknesses are, however, within the broad purview of the present invention.

In one embodiment, the second capacitor electrode 710 and the conductive feature 720 are formed using a copper electroplating process, whereby a thick layer of copper is formed over the entire top surface of the protective overcoat 450, including within the opening 505. Thereafter, the thick layer of copper may be patterned, resulting in the second capacitor electrode 710 and the conductive feature 720. Nevertheless, other different embodiments exist.

Figure 8:
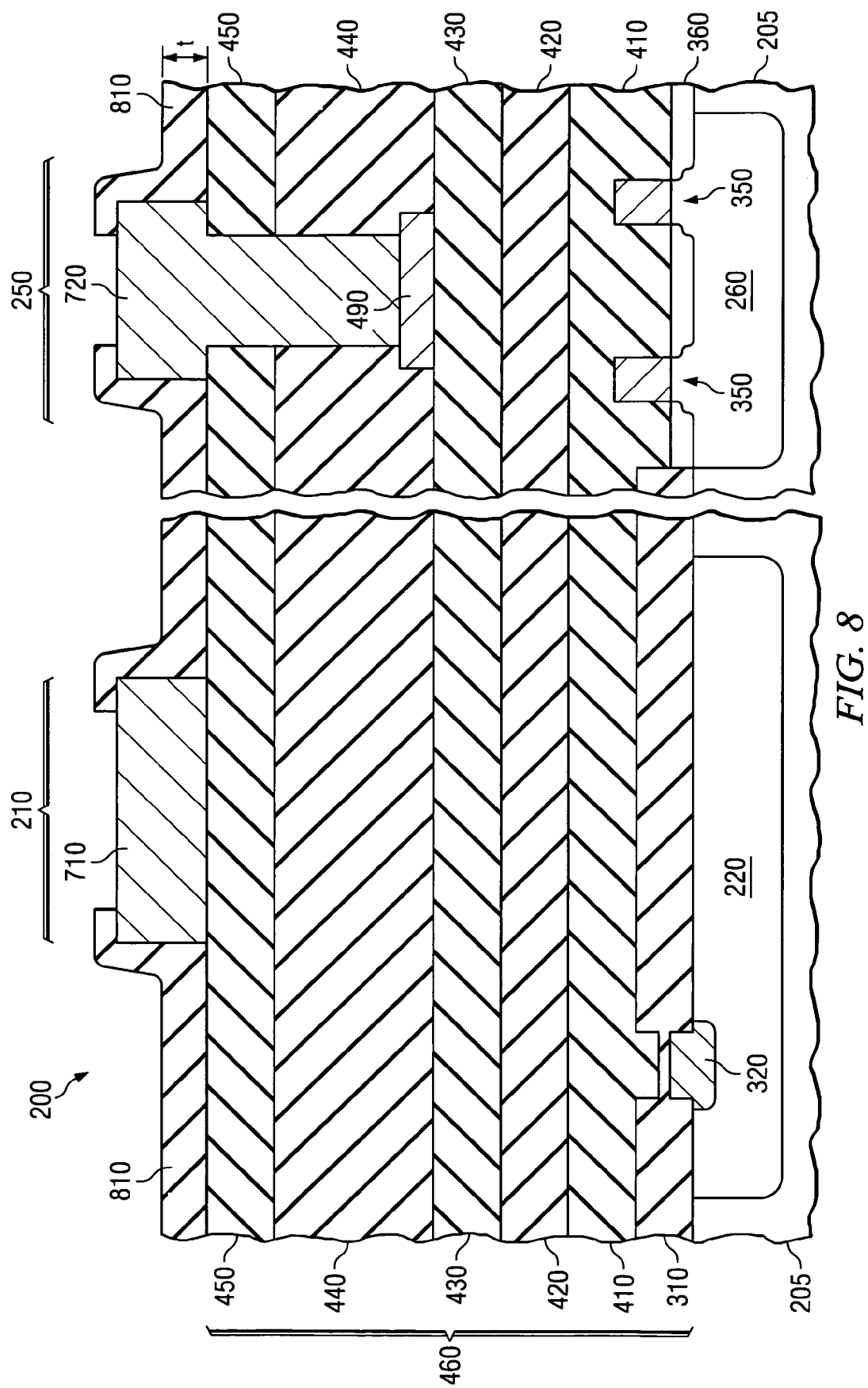

Turning now to FIG. 8, illustrated is the chip 200 of FIG. 7 after forming a top-level dielectric layer 810 along at least a portion of a sidewall of the second capacitor electrode 710. In the embodiment shown, the top-level dielectric layer 810 is located over the protective overcoat layer 450 and along an entire sidewall and at least a portion of an upper surface of each of the second capacitor electrode 710 and the conductive feature 720. Using this configuration, a very large reduction in parasitic leakage is attainable.

The top-level dielectric layer 810, again, may encompass a variety of different materials while staying within the scope of the present invention. For instance, wherein the top-level dielectric layer comprises a spin-on polymer, it might include polyimide, benzyl chlorobutene (BCB), polybenzoxasole (PBO), etc., wherein it comprises another non-polymer spin-on dielectric, it might include hydrogen silsesquioxane (HSQ), spin-on-glass (SOG), etc., or wherein it comprises a deposited dielectric, it might include silicon dioxide, silicon nitride, silicon carbide, etc. While many different materials have been provided, is believed that the spin-on polymers may provide the best overall results. This belief is based in part on the reduced temperatures associated with the formation of the spin-on polymer materials. Nevertheless, the present invention should not be limited to any specific material.

The top-level dielectric layer 810 may be formed using various well-known processes, the process depending on whether it is a spin-on dielectric or deposited dielectric. For instance, in the embodiment wherein the top-level dielectric layer 810 comprises a spin-on dielectric, it may first be spun onto the substrate (e.g., in this embodiment the top-level of the chip 100), thereafter exposed, developed and then cured, resulting in a layer similar to that illustrated in FIG. 8. The use of a photo package is particularly beneficial when opting for the spin-on dielectric. Alternatively, the top-level dielectric layer 810 could be conventionally deposited, including the depositing, patterning and etching of the top-level dielectric layer 810 to leave it only in the desired locations. In one embodiment, the top-level dielectric 810 is removed from at least a portion of the tops of the bond pads, at least a portion of the tops of the second capacitor electrode 710 and typically the scribe lines. What results after forming the top-level dielectric layer 810 is a device substantially similar to the chip 100 illustrated and described with respect to FIG. 1.

Although the present invention has been described in detail, those skilled in the art should understand that they could make various changes, substitutions and alterations herein without departing from the spirit and scope of the invention in its broadest form.

What is claimed is:

1. A method for manufacturing a high voltage capacitor integrated with one or more transistors, the method comprising:
   forming the one or more transistors over or in a substrate;
   forming one or more interlevel dielectric layers over the one or more transistors;
   forming a conductive feature over the interlevel dielectric layers;
   forming a first capacitor plate over or in the substrate;
   forming an insulator over the first capacitor plate, at least a portion of the insulator comprising the interlevel dielectric layer;
   forming a second capacitor plate over the insulator, the second capacitor plate formed in the same processing step as the conductive feature; and
   forming a top-level dielectric layer at least partially along a sidewall of the second capacitor plate.

2. The method as recited in claim 1 wherein the top-level dielectric layer is located entirely along the sidewall and at least partially over a top portion of the second capacitor plate.

3. The method as recited in claim 1 wherein the top-level dielectric layer comprises a spin-on dielectric selected from the group consisting of:
   polyimide;
   benzyl chlorobutene (BCB); and
   polybenzoxasole (PBO).

4. The method as recited in claim 1 wherein the top-level dielectric layer has a thickness of at least about 5 μm.

5. The method as recited in claim 1 wherein the first capacitor plate is a doped region in the substrate.

6. The method as recited in claim 5 wherein the second capacitor plate is a bond pad located over a protective overcoat located over the first capacitor plate, the interlevel dielectric layer and the protective overcoat forming at least a portion of the insulator.

7. The method recited in claim 1 wherein the top-level dielectric layer comprises a spin-on dielectric comprising hydrogen silsesquioxane (HSQ) or spin-on-glass (SOG).

8. The method as recited in claim 1 wherein the top-level dielectric layer comprises a deposited dielectric selected from the group consisting of:
   silicon dioxide;
   silicon nitride; and
   silicon carbide.

9. The method recited in claim 1 wherein the top-level dielectric layer has a thickness from about 5 μm to about 20 μm.

10. An integrated circuit chip, comprising:
    one or more transistors located over or in a substrate, the one or more transistors having one or more interlevel dielectric layers located thereover, and a conductive feature formed over the interlevel dielectric layers;
    a high voltage capacitor including a first capacitor plate located at least partially in or over the substrate, an insulator and a second capacitor plate, wherein at least one of the one or more interlevel dielectric layers forms at least a portion of the insulator; and
    a top-level dielectric layer located at least partially along a sidewall of the second capacitor plate and at least partially along a sidewall of the conductive feature, the top-level dielectric layer configured to reduce parasitic leakage between the second capacitor plate and other conductive features located proximate thereto.

11. The integrated circuit chip as recited in claim 10 wherein the top-level dielectric layer is located entirely along the sidewall and at least partially over a top portion of the second capacitor plate.

12. The integrated circuit chip us recited in claim 10 wherein the top-level dielectric layer comprises a spin-on dielectric selected from the group consisting of:
    polyimide;
    benzyl chlorobutene (BCB); and
    polybenzoxasole (PBO).

13. The integrated circuit chip as recited in claim 10 wherein the top-level dielectric layer comprises a spin-on dielectric comprising hydrogen silsesquioxane (HSQ) or spin-on-glass (SOG).

14. The integrated circuit chip as recited in claim 10 wherein the top-level dielectric layer comprises a deposited dielectric selected from the group consisting of:
    silicon dioxide;
    silicon nitride; and
    silicon carbide.

15. The integrated circuit chip as recited in claim 10 wherein the top-level dielectric layer has a thickness of at least about 5 μm.

16. The integrated circuit chip as recited in claim 10 wherein the top-level dielectric layer has a thickness ranging from about 5 μm to about 20 μm.

17. The integrated circuit chip as recited in claim 10 wherein the first capacitor plate is a doped region in the substrate.

18. The integrated circuit chip as recited in claim 17 wherein the second capacitor plate is a bond pad located over a protective overcoat located over the first capacitor plate, the interlevel dielectric layer and the protective overcoat forming at least a portion of the insulator.

* * * * *